US010168869B2

(12) United States Patent
Lilleness et al.

(10) Patent No.: US 10,168,869 B2
(45) Date of Patent: *Jan. 1, 2019

(54) SYSTEM AND METHOD FOR RETRIEVING INFORMATION WHILE COMMANDING OPERATION OF AN APPLIANCE

(71) Applicant: Universal Electronics Inc., Santa Ana, CA (US)

(72) Inventors: Robert P. Lilleness, Newport Beach, CA (US); Han-Sheng Yuh, Diamond Bar, CA (US); Weidong William Wang, Tustin, CA (US); Wayne Scott, Newport Beach, CA (US)

(73) Assignee: Universal Electronics Inc., Santa Ana, CA (US)

( * ) Notice: Subject to any disclaimer, the term of this patent is extended or adjusted under 35 U.S.C. 154(b) by 953 days.

This patent is subject to a terminal disclaimer.

(21) Appl. No.: 13/801,157

(22) Filed: Mar. 13, 2013

(65) Prior Publication Data

US 2014/0101563 A1    Apr. 10, 2014

Related U.S. Application Data

(63) Continuation of application No. 11/643,883, filed on Dec. 21, 2006, now Pat. No. 9,727,213, which is a
(Continued)

(51) Int. Cl.
*G06F 3/0484*    (2013.01)
*G06F 3/0481*    (2013.01)
(Continued)

(52) U.S. Cl.
CPC .......... *G06F 3/0484* (2013.01); *G06F 3/0481* (2013.01); *G06F 3/04817* (2013.01); *G06F 3/04842* (2013.01); *G06F 9/445* (2013.01); *G08C 17/00* (2013.01); *G08C 17/02* (2013.01); *G08C 19/28* (2013.01); *G10L 17/22* (2013.01); *H03J 1/0025* (2013.01); *H04B 1/202* (2013.01);
(Continued)

(58) Field of Classification Search
CPC ........................ H04N 21/4622; H04N 21/482
See application file for complete search history.

(56) References Cited

U.S. PATENT DOCUMENTS 4,623,887 A    11/1986  Welles, II
4,703,359 A    10/1987  Rumbolt et al.
(Continued)

FOREIGN PATENT DOCUMENTS

EP    0561435 A2    9/1993
EP    0801342       10/1997
(Continued)

OTHER PUBLICATIONS

Sony Corporation, Integrated Remote Commander, 2000, pp. 1-76.
(Continued)

*Primary Examiner* — Ryan F Pitaro
(74) *Attorney, Agent, or Firm* — Greenberg Traurig, LLP

(57) ABSTRACT

When a command key of a controlling platform is activated, the platform performs an operation to initiate a playing of media content and also initiates the retrieval of information from an information source.

13 Claims, 6 Drawing Sheets

Related U.S. Application Data continuation of application No. 10/288,727, filed on Nov. 6, 2002, now Pat. No. 7,831,930.

(60) Provisional application No. 60/344,020, filed on Dec. 20, 2001, provisional application No. 60/344,774, filed on Nov. 20, 2001.

(51) Int. Cl.
| | |
|---|---|
| G06F 9/445 | (2018.01) |
| G08C 17/00 | (2006.01) |
| G08C 19/28 | (2006.01) |
| H03J 1/00 | (2006.01) |
| H04B 1/20 | (2006.01) |
| H04L 12/28 | (2006.01) |
| H04N 5/44 | (2011.01) |
| H04N 5/445 | (2011.01) |
| H04N 5/50 | (2006.01) |
| H04N 7/16 | (2011.01) |
| H04N 7/173 | (2011.01) |
| H04N 21/258 | (2011.01) |
| H04N 21/41 | (2011.01) |
| H04N 21/422 | (2011.01) |
| H04N 21/436 | (2011.01) |
| H04N 21/462 | (2011.01) |
| H04N 21/485 | (2011.01) |
| H04N 21/6547 | (2011.01) |
| H04N 21/8543 | (2011.01) |
| H04L 12/24 | (2006.01) |
| G10L 17/22 | (2013.01) |
| G08C 17/02 | (2006.01) |
| H04N 21/431 | (2011.01) |
| H04N 21/47 | (2011.01) |
| G06F 3/0482 | (2013.01) |

(52) U.S. Cl.
CPC ........ *H04L 12/2816* (2013.01); *H04L 41/509* (2013.01); *H04N 5/4403* (2013.01); *H04N 5/44543* (2013.01); *H04N 5/44582* (2013.01); *H04N 5/50* (2013.01); *H04N 7/16* (2013.01); *H04N 7/17318* (2013.01); *H04N 21/25891* (2013.01); *H04N 21/4126* (2013.01); *H04N 21/4131* (2013.01); *H04N 21/42204* (2013.01); *H04N 21/43615* (2013.01); *H04N 21/4622* (2013.01); *H04N 21/485* (2013.01); *H04N 21/6547* (2013.01); *H04N 21/8543* (2013.01); *G06F 3/0482* (2013.01); *G08C 2201/21* (2013.01); *G08C 2201/30* (2013.01); *G08C 2201/33* (2013.01); *G08C 2201/50* (2013.01); *G08C 2201/91* (2013.01); *G08C 2201/92* (2013.01); *H03J 2200/23* (2013.01); *H03J 2200/25* (2013.01); *H03J 2200/26* (2013.01); *H04B 1/20* (2013.01); *H04N 5/4401* (2013.01); *H04N 21/4316* (2013.01); *H04N 21/47* (2013.01); *H04N 2005/441* (2013.01); *H04N 2005/4425* (2013.01); *H04N 2005/4433* (2013.01)

(56) References Cited

U.S. PATENT DOCUMENTS

| | | | |
|---|---|---|---|
| 4,774,511 A | 9/1988 | Rumbolt et al. | |
| 4,825,200 A | 4/1989 | Evans et al. | |
| 4,894,789 A | 1/1990 | Yee | |
| 4,959,810 A | 9/1990 | Darbee et al. | |
| 5,005,084 A | 4/1991 | Skinner | |
| 5,231,493 A | 7/1993 | Apitz | |
| 5,253,066 A | 10/1993 | Vogel | |
| 5,282,028 A | 1/1994 | Johnson et al. | |
| 5,293,357 A | 3/1994 | Hallenbeck | |
| 5,307,055 A | 4/1994 | Baskin et al. | |
| 5,410,326 A | 4/1995 | Goldstein | |
| 5,450,079 A | 9/1995 | Dunaway | |
| 5,479,266 A | 12/1995 | Young et al. | |
| 5,481,256 A | 1/1996 | Darbee et al. | |
| 5,485,197 A | 1/1996 | Hoarty | |
| 5,552,806 A | 9/1996 | Lenchik | |
| 5,559,548 A | 9/1996 | Davis et al. | |
| 5,565,888 A | 10/1996 | Selker | |
| 5,574,964 A | 11/1996 | Hamlin | |
| 5,614,906 A | 3/1997 | Hayes et al. | |
| 5,635,978 A | 6/1997 | Alten et al. | |
| 5,635,989 A | 6/1997 | Rothmuller | |
| 5,648,760 A | 7/1997 | Kumar | |
| 5,652,613 A | 7/1997 | Lazarus et al. | |
| 5,671,267 A | 9/1997 | August et al. | |
| 5,710,601 A | 1/1998 | Marshall et al. | |
| 5,710,605 A | 1/1998 | Nelson | |
| 5,724,106 A | 3/1998 | Autry et al. | |
| 5,724,492 A | 3/1998 | Matthews, III et al. | |
| 5,751,372 A | 5/1998 | Forson | |
| 5,761,606 A | 6/1998 | Wolzien | |
| 5,793,438 A | 8/1998 | Bedard | |
| 5,801,787 A | 9/1998 | Schein et al. | |
| 5,828,419 A | 10/1998 | Bruette et al. | |
| 5,835,864 A | 11/1998 | Diehl et al. | |
| 5,838,775 A | 11/1998 | Montalbano | |
| 5,855,006 A | 12/1998 | Huemoeller et al. | |
| 5,872,562 A | 2/1999 | McConnell et al. | |
| 5,883,680 A | 3/1999 | Nykerk | |
| 5,895,462 A * | 4/1999 | Toki | G06F 17/30887 |
| | | | 379/102.03 |
| 5,900,875 A | 5/1999 | Haitani et al. | |
| 5,901,366 A | 5/1999 | Nakano et al. | |
| 5,915,026 A | 6/1999 | Mankovitz | |
| 5,933,090 A | 8/1999 | Christenson | |
| 5,936,611 A | 8/1999 | Yoshida | |
| 5,945,988 A | 8/1999 | Williams et al. | |
| 5,956,025 A * | 9/1999 | Goulden | G06F 3/033 |
| | | | 345/169 |
| 5,970,206 A | 10/1999 | Yuen et al. | |
| 5,974,222 A | 10/1999 | Yuen et al. | |
| 6,002,394 A | 12/1999 | Schein et al. | |
| 6,002,450 A | 12/1999 | Darbee et al. | |
| 6,012,071 A | 1/2000 | Krishna et al. | |
| 6,014,092 A | 1/2000 | Darbee et al. | |
| 6,018,372 A | 1/2000 | Etheredge | |
| 6,020,881 A | 2/2000 | Naughton et al. | |
| 6,028,599 A | 2/2000 | Yuen et al. | |
| 6,028,600 A | 2/2000 | Rosin et al. | |
| 6,040,829 A | 3/2000 | Croy et al. | |
| 6,067,552 A | 5/2000 | Yu | |
| 6,097,441 A | 8/2000 | Allport | |
| 6,104,334 A | 8/2000 | Allport | |
| 6,127,941 A | 10/2000 | Van Ryzin | |
| 6,130,726 A * | 10/2000 | Darbee | G06F 3/147 |
| | | | 348/734 |
| 6,133,909 A | 10/2000 | Schein et al. | |
| 6,137,549 A | 10/2000 | Rasson et al. | |
| 6,151,059 A | 11/2000 | Schein et al. | |
| 6,172,674 B1 | 1/2001 | Etheredge | |
| 6,177,931 B1 | 1/2001 | Alexander et al. | |
| 6,195,548 B1 | 2/2001 | Schultheiss | |
| 6,195,589 B1 | 2/2001 | Ketcham | |
| 6,198,481 B1 | 3/2001 | Urano et al. | |
| 6,211,856 B1 | 4/2001 | Choi et al. | |
| 6,211,870 B1 | 4/2001 | Foster | |
| 6,211,878 B1 | 4/2001 | Cheng et al. | |
| 6,211,921 B1 | 4/2001 | Cherian et al. | |
| 6,219,694 B1 | 4/2001 | Lazaridis et al. | |
| 6,225,938 B1 | 5/2001 | Hayes et al. | |
| 6,255,961 B1 | 7/2001 | Van Ryzin et al. | |
| 6,256,019 B1 | 7/2001 | Allport | |
| 6,266,098 B1 | 7/2001 | Cove et al. | |
| 6,278,499 B1 | 8/2001 | Darbee et al. | |
| 6,285,357 B1 | 9/2001 | Kushiro et al. | |

(56) References Cited

U.S. PATENT DOCUMENTS

| | | |
|---|---|---|
| 6,311,329 B1 | 10/2001 | Tarakado et al. |
| 6,321,991 B1 | 11/2001 | Knowles |
| 6,341,374 B2 | 1/2002 | Schein et al. |
| 6,344,861 B1 | 2/2002 | Naughton et al. |
| 6,369,840 B1 | 4/2002 | Barnett et al. |
| 6,370,571 B1 * | 4/2002 | Medin, Jr. ............... G06F 21/10 709/202 |
| 6,408,435 B1 | 6/2002 | Sato |
| 6,424,660 B2 | 7/2002 | Jacobson, Jr. |
| 6,425,129 B1 * | 7/2002 | Sciammarella .... H04N 5/44543 348/E5.002 |
| 6,437,836 B1 * | 8/2002 | Huang .................. G06F 1/1626 340/12.54 |
| 6,463,463 B1 | 10/2002 | Godfrey et al. |
| 6,469,633 B1 | 10/2002 | Wachter |
| 6,532,589 B1 | 3/2003 | Proehl et al. |
| 6,538,635 B1 | 3/2003 | Ringot |
| 6,563,430 B1 | 5/2003 | Kemink et al. |
| 6,577,350 B1 | 6/2003 | Proehl et al. |
| 6,597,374 B1 | 7/2003 | Baker et al. |
| 6,643,707 B1 * | 11/2003 | Booth ..................... H04L 12/18 348/E7.07 |
| 6,650,894 B1 | 11/2003 | Berstis et al. |
| 6,670,971 B1 | 12/2003 | Oral |
| 6,690,392 B1 | 2/2004 | Wugoski |
| 6,710,771 B1 | 3/2004 | Yamaguchi et al. |
| 6,721,288 B1 * | 4/2004 | King ....................... H04L 29/06 370/310 |
| 6,757,707 B1 | 6/2004 | Houghton et al. |
| 6,822,661 B2 | 11/2004 | Sai et al. |
| 6,848,104 B1 | 1/2005 | Van Ee et al. |
| 6,938,101 B2 | 8/2005 | Hayes et al. |
| 6,996,779 B2 | 2/2006 | Meandzija et al. |
| 7,197,708 B1 | 3/2007 | Frendo et al. |
| 7,199,836 B1 * | 4/2007 | Eleftheriadis .... H04N 21/23412 345/630 |
| 7,746,244 B2 | 6/2010 | Wouters |
| 2001/0011953 A1 | 8/2001 | Shintani et al. |
| 2001/0033243 A1 | 10/2001 | Harris et al. |
| 2001/0053274 A1 | 12/2001 | Roelofs et al. |
| 2001/0054112 A1 * | 12/2001 | Nobakht ........... G06F 17/30884 709/245 |
| 2002/0010756 A1 * | 1/2002 | Oku ........................ H04L 29/06 709/217 |
| 2002/0044144 A1 * | 4/2002 | Inoue ...................... H04H 60/47 345/204 |
| 2002/0087981 A1 * | 7/2002 | Daniels .............. H04N 5/44543 725/38 |
| 2002/0093490 A1 | 7/2002 | Lee |
| 2002/0162120 A1 * | 10/2002 | Mitchell ................ H04N 7/165 725/135 |
| 2002/0162121 A1 * | 10/2002 | Mitchell ................ H04N 7/165 725/135 |
| 2002/0174201 A1 * | 11/2002 | Ramer ................ G06F 17/2241 709/220 |
| 2002/0178238 A1 * | 11/2002 | Fletcher ............... G06Q 10/107 709/219 |
| 2003/0018980 A1 | 1/2003 | Gorbatov et al. |
| 2003/0034957 A1 * | 2/2003 | Dubil ................. H04N 5/44543 345/158 |
| 2003/0058269 A1 | 3/2003 | Dunstan |
| 2003/0084456 A1 * | 5/2003 | Ryan ................... H04N 5/44591 725/113 |
| 2003/0095156 A1 * | 5/2003 | Klein .................... G06F 3/0481 715/864 |
| 2004/0068750 A1 * | 4/2004 | Maa ....................... G06Q 30/02 725/113 |
| 2004/0073707 A1 * | 4/2004 | Dillon ............... H04L 29/12009 709/245 |
| 2005/0028206 A1 * | 2/2005 | Cameron ........... H04N 7/17309 725/46 |
| 2005/0028208 A1 | 2/2005 | Ellis et al. |
| 2007/0061326 A1 | 3/2007 | Stading et al. |
| 2008/0191898 A1 * | 8/2008 | Janik .................... H04N 5/4403 340/4.31 |

FOREIGN PATENT DOCUMENTS

| | | |
|---|---|---|
| EP | 0967797 A2 | 12/1999 |
| EP | 0987888 | 3/2000 |
| EP | 1061490 | 12/2000 |
| EP | 1204275 A2 | 5/2002 |
| GB | 2343073 | 4/2000 |
| WO | 98/16062 | 4/1998 |
| WO | 9817063 A1 | 4/1998 |
| WO | 00/17737 | 3/2000 |
| WO | 00/27030 | 5/2000 |
| WO | 00/40016 | 7/2000 |
| WO | 00/58935 | 10/2000 |
| WO | 0078050 A | 12/2000 |
| WO | 01/20572 A1 | 3/2001 |
| WO | 0124473 A1 | 4/2001 |
| WO | WO 0148661 A2 * | 7/2001 ............. G06Q 30/02 |
| WO | 01/74051 | 10/2001 |

OTHER PUBLICATIONS

USPTO, Office Action issued on U.S. Appl. No. 13/298,629, dated Oct. 3, 2013, 17 pages.

USPTO, Office Action issued on U.S. Appl. No. 12/855,501, dated Sep. 27, 2013, 32 pages.

USPTO, Final Office Action issued on U.S. Appl. No. 12/855,501, dated Jul. 14, 2017, 24 pages.

U.S. Patent Office, Non-Final Office Action issued on U.S. Appl. No. 14/047,072, dated Dec. 21, 2017, 28 pgs.

* cited by examiner

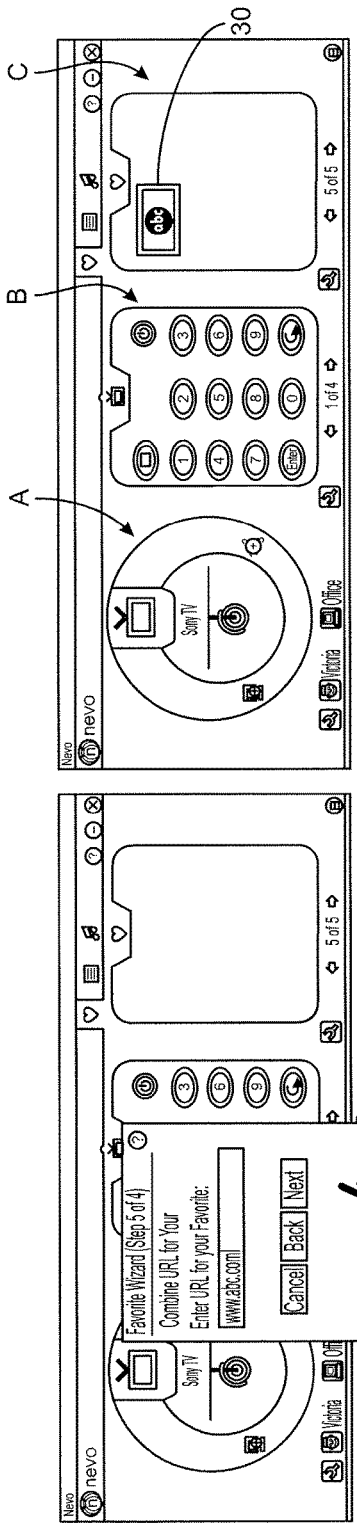
FIG. 12
FIG. 13
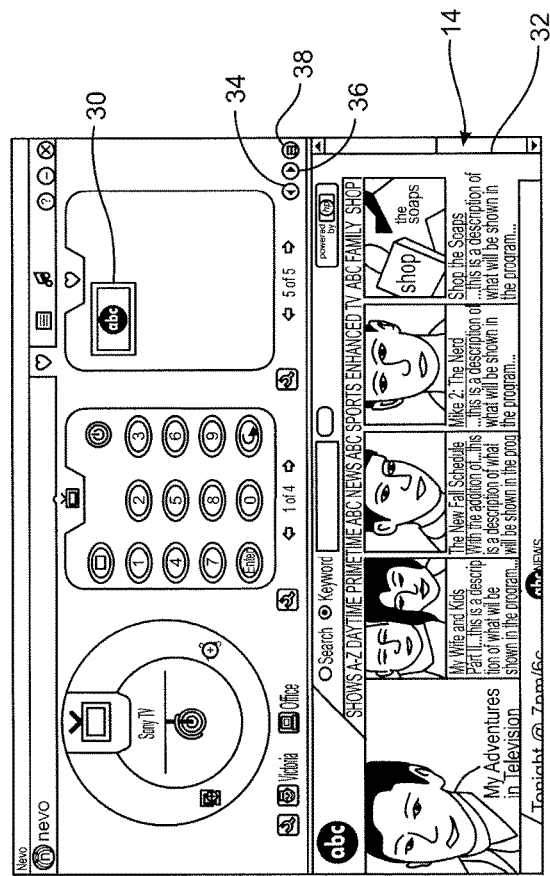
FIG. 14

SYSTEM AND METHOD FOR RETRIEVING INFORMATION WHILE COMMANDING OPERATION OF AN APPLIANCE

RELATED APPLICATION INFORMATION

This application claims the benefit of and is a continuation of U.S. application Ser. No. 11/643,883, filed on Dec. 21, 2006, which, in turn, claims the benefit of and is a continuation of U.S. application Ser. No. 10/288,727, filed Nov. 6, 2002, which, in turn, claims the benefit of U.S. Provisional Application No. 60/344,020, filed Dec. 20, 2001, and U.S. Provisional Application No. 60/344,774, filed Nov. 20, 2001, each of which is hereby incorporated by reference in its entirety.

This application is also related to U.S. application Ser. No. 10/176,315, filed Jun. 20, 2002, now U.S. Pat. No. 6,747,591, which was incorporated by reference in its entirety in U.S. application Ser. No. 10/288,727, as well as U.S. application Ser. No. 10/785,642, filed Feb. 24, 2004, now U.S. Pat. No. 6,917,302.

BACKGROUND

This invention generally relates to platforms having a display and communication capabilities such as PDAs, Web Tablets, touch screen remote controls, personal computers, and the like.

SUMMARY

A system and method for retrieving information is described. Generally, a command key of a platform has an operation and an address of an information source. When the command key is activated, the platform performs the operation and also initiates the retrieval of information from the information source using the address. In an illustrated example, the operation results in the platform transmitting a command to cause a tunable device, such as a television, VCR, cable box, PVR, or the like, to tune to a channel associated with a content provider. The address may be used to access an information source, such as a Web page, associated with the content provider.

A better understanding of the objects, advantages, features, properties and relationships of the invention will be obtained from the following detailed description and accompanying drawings which set forth illustrative embodiments that are indicative of the various ways in which the principles of the invention may be employed.

BRIEF DESCRIPTION OF THE DRAWINGS

For a better understanding of the various aspects of the invention, reference may be had to preferred embodiments shown in the attached drawings in which:

FIGS. 4-14 illustrate screen shots of an exemplary graphical user interface used to setup a device to retrieve information.

DETAILED DESCRIPTION

Figure 1:
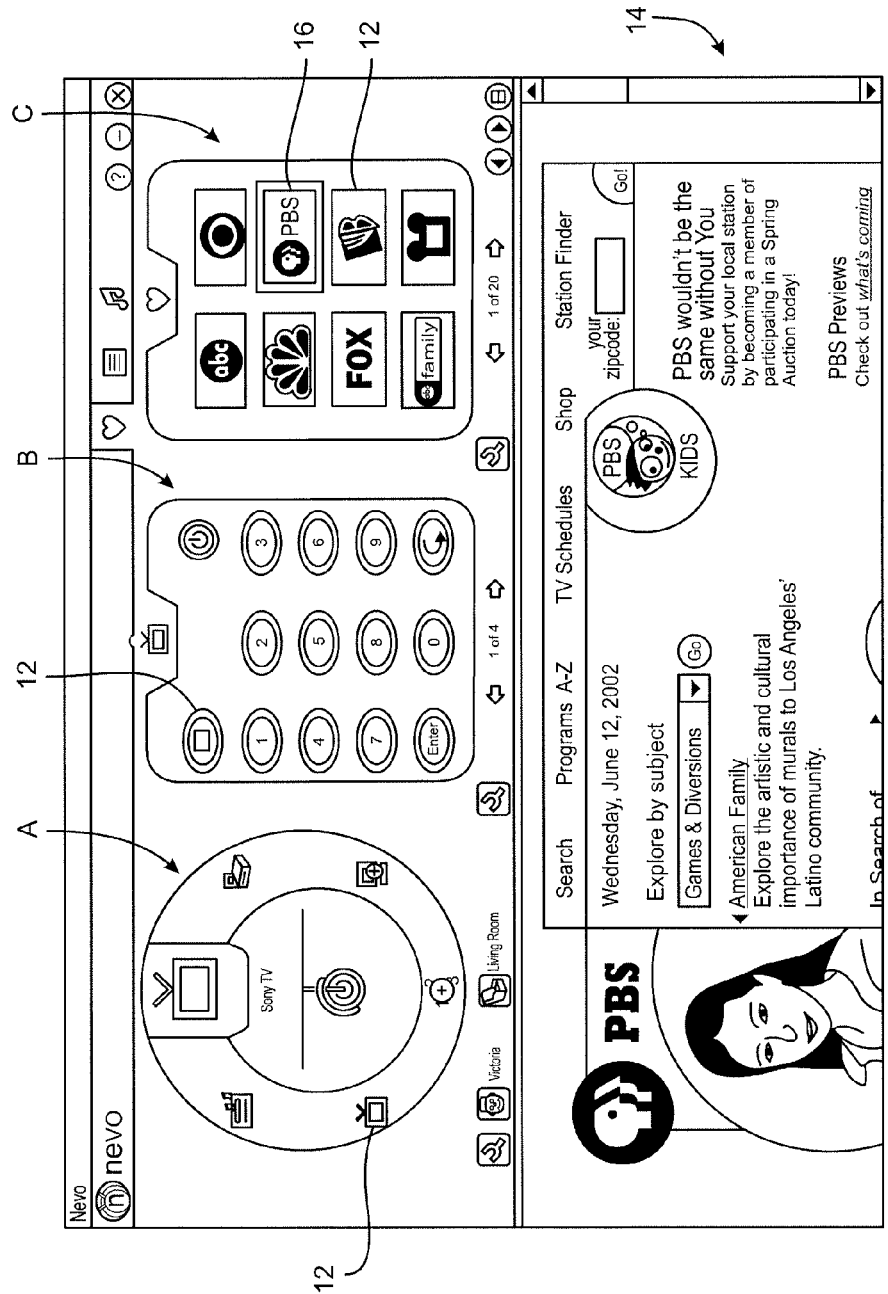
FIGS. 1-3 illustrate screen shots of an exemplary graphical user interface for displaying retrieved information and for commanding the operation of an appliance.

With reference to the figures, wherein like reference numerals refer to like elements, a system and method for retrieving information while commanding operation of an appliance is described. Generally, the system resides on a platform, such as a Web tablet, PDA, personal computer, remote control, or the like, adapted to transmit commands to an appliance. The platform is also adapted to communicate with a source of information, for example, a Web site via the Internet. In this regard, the platform may have hardware and software that allows the platform to communicate directly with the source of information and/or hardware and software that facilitates indirect communication with the source of information, for example, via a personal computer acting as an intermediate gateway to a network server.

By way of more specific example, the underlying platform may include a processor coupled to a memory system comprising a combination of ROM memory, non-volatile read/write memory, and RAM memory (a memory system); a key matrix, mouse, "graffiti" handwriting input pad, or other input device that accepts input from the user; an internal clock and timer; a transmission circuit; a power supply; a display (which may be a touch screen display in lieu of or in addition to the input device) to provide visible feedback to the user; and I/O circuitry for allowing the device to exchange communications with an external computer such as server and/or an intermediate gateway. As noted previously, representative platforms include, but are not limited to, devices such as remote controls, lap-top computers, Web Tablets and/or PDAs manufactured by Compaq, HP, Palm, Visor, etc.

The memory system includes executable instructions that are intended to be executed by the processor to control the operation of the platform. In this manner, the processor may be programmed to control the various electronic components within the device, e.g., to monitor power, to cause the transmission of signals, etc. Within the memory system, the ROM portion of memory is used to store fixed programming and data that remains unchanged for the life of the product. The non-volatile read/write memory, which may be FLASH, EEPROM, battery-backed up RAM, "Smart Card," memory stick, or the like, is provided to store consumer entered setup data and parameters, downloaded data, additional programming, etc., as necessary. RAM memory is used by the processor for working storage as well as to hold data items which, by virtue of being backed up or duplicated on an external computer are not required to survive loss of battery power. While the memory system is described as comprising all three classes of memory, it will be appreciated that, in general, such a memory system need not necessarily support all three, and can be comprised of any type of computer-readable media, such as ROM, RAM, SRAM, FLASH, EEPROM, or the like in combination. Preferably, however, at least part of the memory system should be non-volatile or battery backed such that basic setup parameters and operating features will survive loss of battery power. In addition, such memories may take the form of a chip, a hard disk, a magnetic disk, and/or an optical disk without limitation.

For commanding the operation of appliances of different makes, models, and types, the memory system may include a command code library. The command code library is comprised of a plurality of command codes that may be transmitted from the platform for the purpose of controlling the operation of an appliance. The memory system may also includes instructions which the processor uses in connection with the transmission circuit to cause the command codes to be transmitted in a format recognized by an identified appliance. While the transmission circuit preferably utilizes infrared transmissions, it will be appreciated that other forms of wired or wireless transmissions, such as radio frequency, may also be used.

To identify appliances by type and make (and sometimes model) such that the device is adapted to transmit recognizable command codes in the format appropriate for such identified appliances, information may be entered into the platform. Since methods for setting up a platform to control the operation of specific appliances are well-known, they will not be described in greater detail herein. Nevertheless, for additional details concerning setup operations the reader may turn to U.S. Pat. Nos. 6,225,938, 4,623,887, 5,872,562, 5,614,906, 4,959,810, 4,774,511, and 4,703,359 which are incorporated herein by reference in their entirety.

To cause the platform to perform an operation, the platform is adapted to be responsive to events, such as a sensed interaction with one or more keys on the key matrix, with the touch screen display, or a signal from an external source such as a remote computer. More specifically, in response to an event, appropriate instructions within the memory system are executed. For example, when a hard or soft command key is activated on the platform, the platform may read the command code corresponding to the activated command key from the memory system and transmit the command code to an appliance in a format recognizable by the appliance. It will be appreciated that the instructions within the memory system can be used not only to cause the transmission of command codes to appliances but also to perform local operations. While not limiting, local operations that may be performed by the device include favorite channel setup, macro button setup, command function key relocation, etc. Examples of local operations can be found in U.S. Pat. Nos. 5,481,256, 5,959,751, 6,014,092, which are incorporated herein by reference in their entirety.

As discussed, the platform comprises a general purpose, processor system which is controllable by software. The software may include routines, programs, objects, components, and/or data structures that perform particular tasks that can be viewed as an operating system together with one or more applications. The operating system, such as the "Windows CE" or "Windows XP" brand operating system or the like, provides an underlying set of management and control functions which are utilized by applications to offer consumer functions such as calendar, address book, spreadsheet, notepad, etc., as well as control of appliances. Additional applications can be provided for use in accessing Internet data, displaying TV guide information, and the like. Thus, it should be understood that, in terms of the internal software architecture, a "remote control" application may be but one of several possible applications which may co-exist within the platform. It should also be understood that in terms of providing operating system functionality, the demarcation between a platform and a host/client PC may vary considerably from product to product—at one extreme the platform may be nothing more than a slave display and input device in wireless communication with a PC that performs all computational functions and, at the other extreme, the platform may be a fully-functional PC system in its own right complete with local mass storage. It will also be appreciated that in an alternative embodiment, a similar hardware platform to that described above may be used in conjunction with a scaled-down operating system to provide remote control functionality only, i.e., as a standalone application. In all cases, however, the principles expressed herein remain the same.

To provide a means by which a consumer can interact with the platform, the platform is provided with software that implements a graphical user interface. The graphical user interface software may also provide access to additional software, such as a browser application, that is used to display to the consumer items that may be retrieved from local memory or from an external computer. Such a graphical user interface system is described in U.S. Applications 60/264,767, 60/334,774, and 60/344,020 all of which are incorporated herein by reference in their entirety. The browser application may comprise an integral extension of the graphical user interface software, or may be a separate program supplied as part of the underlying operating system or its accompanying utility software and accessed via a standardized interface such Microsoft's COM (Component Object Module) technology.

The graphical user interface may also be used to provide a system and method for displaying information that is retrieved in response to the receipt of an event commanding the platform to perform an operation. The event may direct the platform to perform a local operation and/or an operation to transmit a command to an appliance. For example, with reference to FIGS. 1-3, the graphical user interface can be used to display one or more pages (A, B, and C) of selectable command icons 12 by which the user may, among other things, generate events to control the operation of the platform where: page A is provided as a means by which a user may place the platform in a mode to control a selected appliance; page B is provided as a means by which a user may direct the transmission of commands to the selected appliance; and page C provides a means by which a user may cause the transmission of commands to tune an appliance to a designated favorite, such as a favorite television program. As this aspect of the graphical user interface is described in detail in the incorporated U.S. Applications 60/264,767, 60/334,774, and 60/344,020 it will not be described further herein.

Figure 2:
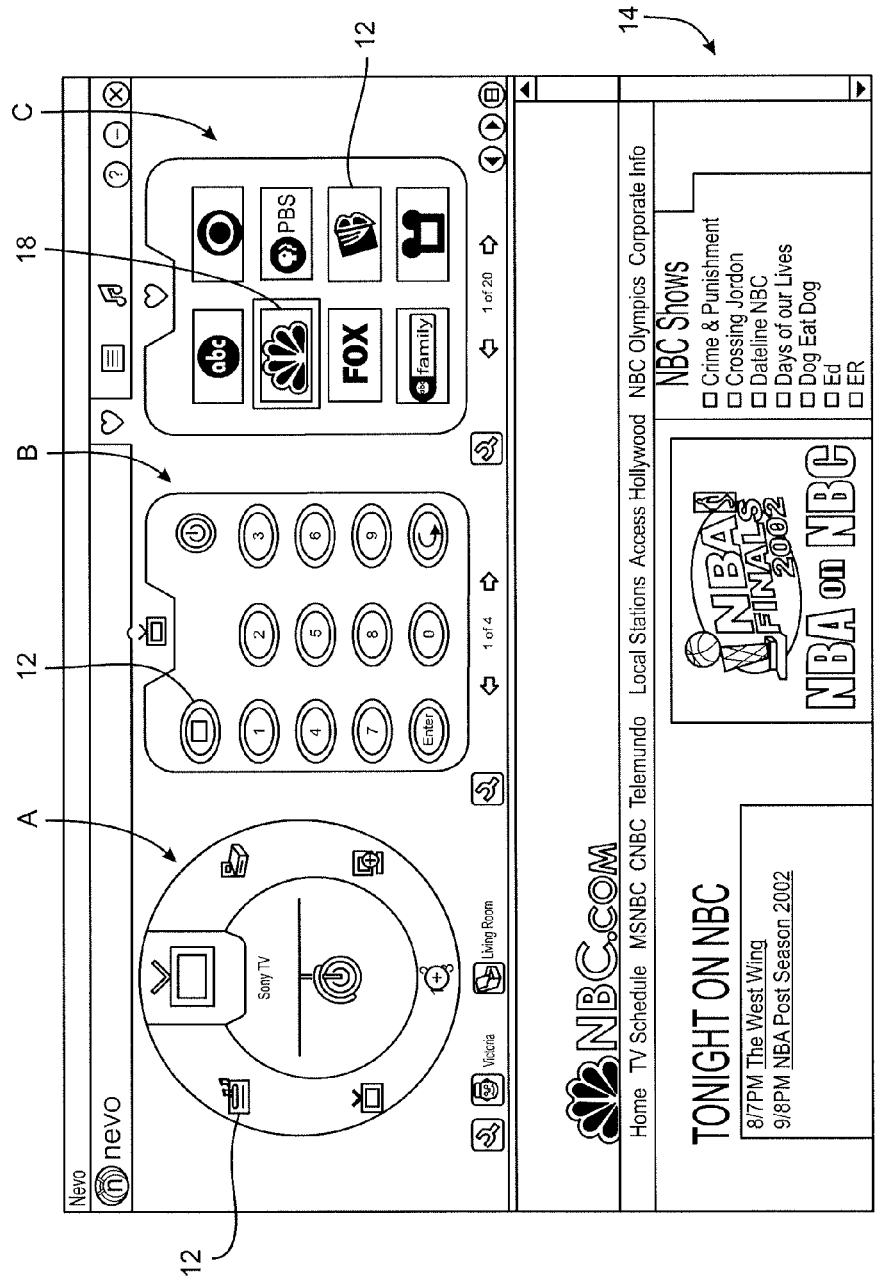
Figure 3:
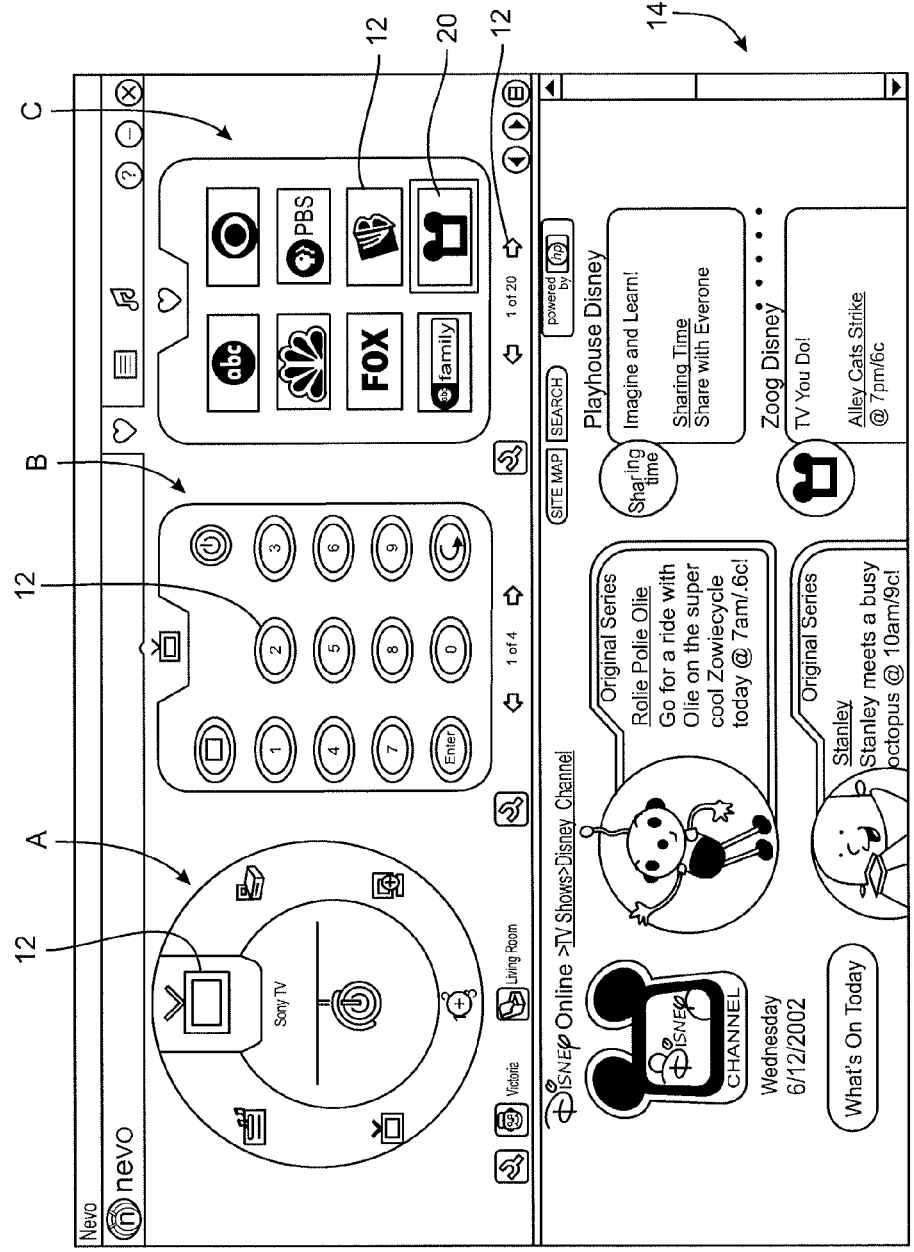
Figure 5:
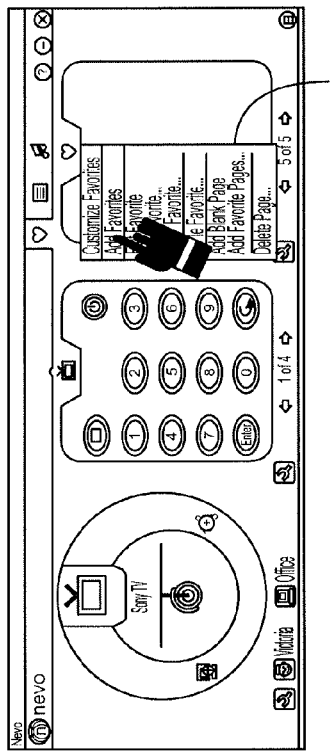
Figure 7:
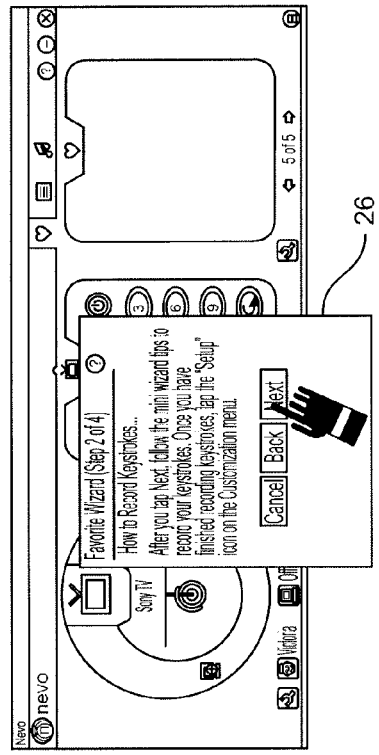

The graphical user interface may also provide an area within a display, such as window 14, in which information is presented to the user. For example, FIG. 1 illustrates information in the form of a "PBS" Web page that was retrieved via the Internet (either directly of via an intermediate gateway) in response to the user activating command icon 16 that was programmed to cause the transmission of a command to tune an appliance, such as a television, to the channel on which PBS is broadcast. FIG. 2 similarly illustrates information in the form of an "NBC" Web page that was retrieved via the Internet in response to the user activating command icon 18 that was programmed to cause the transmission of a command to tune an appliance, such as a television, to the channel on which NBC is broadcast. FIG. 3 also illustrates information in the form of a "Disney" Web page that was retrieved via the Internet in response to the user activating command icon 20 that was programmed to cause the transmission of a command to tune an appliance, such as a television, to the channel of which the Disney station is broadcast.

Figure 4:
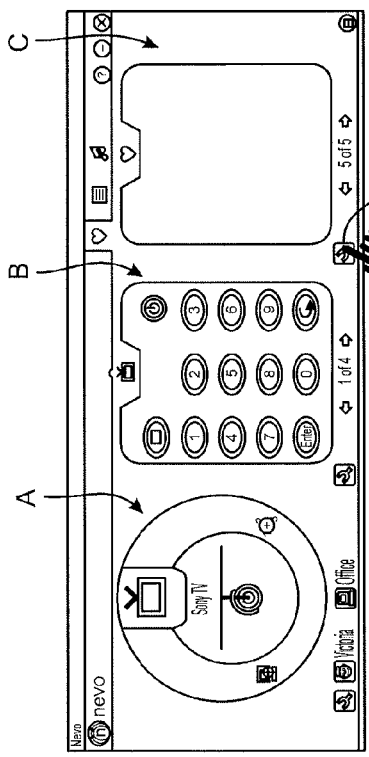

To setup the platform to retrieve information, exemplary steps are illustrated in FIGS. 4-14. In the example, the user interacts with the platform to indicate a desire to setup the platform to transmit user-specified command codes in addition to retrieving information. This desire may be indicated by the user selecting a general setup command icon 22 as illustrated in FIG. 4. In response to the selection of the setup command icon 22, the user may be presented with an optional menu 24, illustrated in FIG. 5, by which the user may further specify a desire to setup one or more features of the platform. In this case, the user indicates a desire to add a command icon to the favorites page (i.e., page C of the exemplary graphical user interface). This, in turn, commences a setup wizard 26, illustrated in FIGS. 6-12, that guides the user through the procedure for setting up the command icon to-be-added to the graphical user interface.

Figure 6:
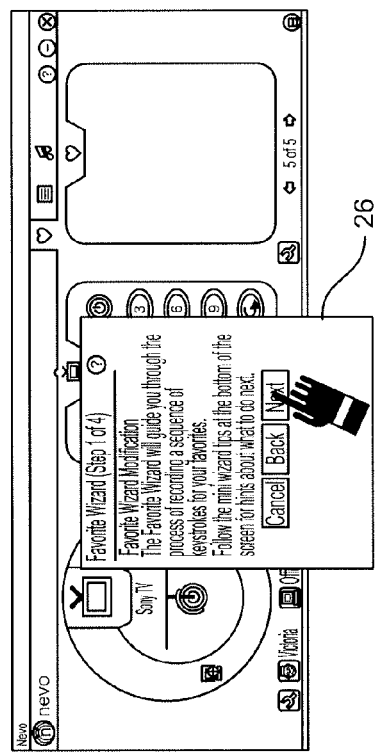
Figure 8:
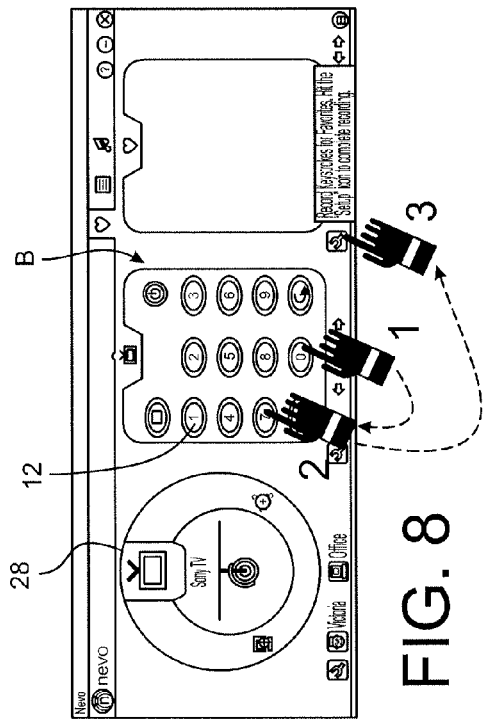
Figure 9:
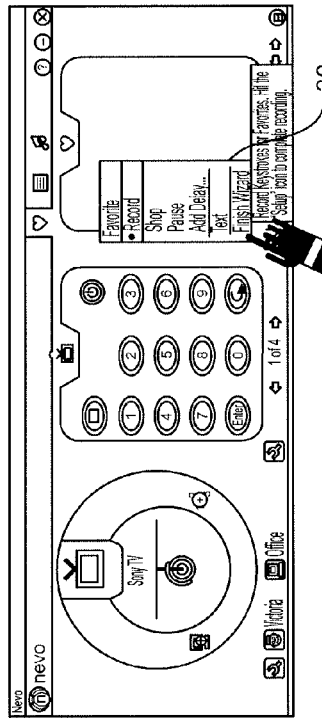

The setup wizard 26 may first present to the user a general information page, illustrated in FIG. 6, followed by an instruction page that directs the user to enter one or more keystrokes (i.e., activations of hard key(s) and/or command icon(s) in the form of soft keys) which cause the platform to perform one or more operations which operations the platform is to repeat when the to-be-added command icon is activated. As will be appreciated, the keystrokes may be used to command the platform to transmit command codes, cause the platform to perform a local operation, or the like. In the example illustrated in FIG. 8, the keystroke assignment process is used to indicate a desire to have the platform transmit command codes to an appliance to tune the appliance (e.g., a television as indicated by the mode command icon 28) to a desired channel number (e.g., channel "07" resulting from the activation of command icon "0" followed by the activation of command icon "7" followed by activation of the wrench icon 22 used to signify the end of sequence). Once the end of the operational sequence is reached, a further menu 30, illustrated in FIG. 9, may be presented to the user to allow the user to edit the sequence, indicate that the sequence is acceptable, test the sequence, etc. To further allow for the testing of the sequence, the platform can perform operations in accordance with the keystrokes as the user enters the keystrokes during the setup procedure. In the example provided, this would result in the platform transmitting the commands to tune the television to channel 7 as the user sets up the to-be-added command icon. It will be appreciated that operations to be assigned to the to-be-added command icon can also be specified by means of menu selections or the like and need not be limited to keystroke tracking.

Figure 10:
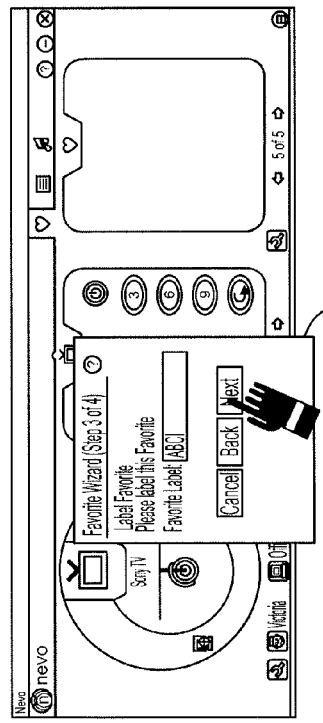
Figure 11:
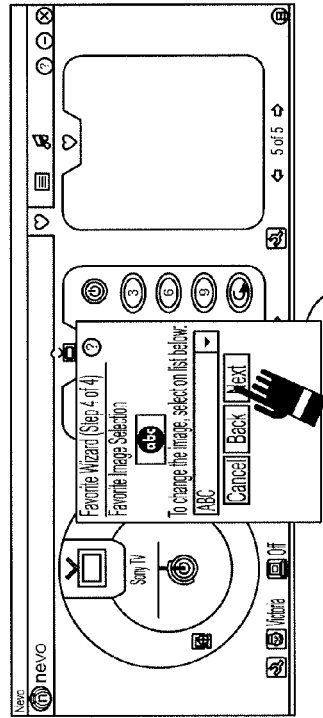

Once the user has indicated to the platform the operations to assign to the to-be-added command icon, the user may select how the to-be-added command icon will appear to the user in the graphical user interface. To this end, the user may enter a text label to be associated with the to-be-added command icon as illustrated in FIG. 10 and/or select an image for the to-be-added command icon as illustrated in FIG. 11. The images may be selected by scrolling, for example, through an image library having preloaded, downloaded via the Internet, and/or user created icon images. Once the image has been selected and/or created, the user may then enter an address for an information repository that is to be accessed when the to-be-added icon is activated. While illustrated in FIG. 12 as the URL of a Web site on the Internet, it will be appreciated that the information repository can have a local or remote address and that the addressing scheme need not be limited to the use of URLs. Rather, any known or future developed addressing scheme would be supported.

When the user has finished the entering of the address of the information repository, for example by activating the next icon in the address entry screen 26a of the setup wizard 26, the to-be-added icon is then added to the favorites page, page C, as an activatable command icon 30 as illustrated in FIG. 13. In this manner, in keeping with the example provided, subsequent activation of the command icon 30 by the user results in the transmission of the command codes to tune a television to channel 7 and also the issuing of a request to retrieve information from the specified address, here "www.abc.com." Any information retrieved from the specified information repository is presented in window 14 as illustrated in FIG. 14.

Since the exemplary window 14 may be adapted to present markup language content as is common in Web pages, the user should also be provided with the ability to interact with any displayed information to retrieve further information, for example, by clicking on a hyperlink 32 presented in a retrieved Web page. Conventional Web browser forward 34 and back 36 command icons may be activated to navigate through a series of retrieved information pages. A windowing command icon 38 may also be activated to toggle the window 14 between a collapsed state (i.e., generally remove it from the display) and an active state (i.e., to return the window to the display).

In the case where the user has not specified an address for the information repository, a default address can be used or no retrieval action performed. The default address can be a predetermined address that is mapped to a specific label and/or image in the image library which address is used when the corresponding label and/or image is selected for a to-be-added command icon. For example, the web address of a content provider (e.g., "www.espn.com") can be mapped as the predefined Web address for an icon image that depicts the network logo of the content provider. The predefined address could also be a manufacturer Web address which would take the user to information pages, registration pages, etc. of the manufacturer of the platform, the platform software provider, or the appliance to be commanded. When predefined addresses are utilized, these addresses may be presented to the user in the address setup screen to allow the user to change the address. Alternatively, a predefined address can be unalterable in which case the step of allowing a user to enter the address would be skipped.

Still further, the described process need not be limited to setting up addresses when adding command icons to the favorites page. Rather, any command icon may be available to be setup such that activation of that command icon also retrieves information from an information repository. For example, activation of a command icon in the device mode wheel of page A can cause the platform to enter a mode for commanding an appliance and to retrieve information related to that appliance, e.g., the platform may address "www.sony.com" in the event the TV mode icon 28 is used to place the platform in a mode to command a "Sony" brand television. Similarly, the favorites page of page C can display a group of predetermined images of command icons that the user can setup to access information (and, if need be, to transmit appropriate command codes). It is contemplated that, in the case where cable operators provide the platform to customers, some or all of the favorites page may be pre-populated with command icons that may or may not have preset addresses mapped thereto.

By way of further example, it is contemplated that operations performed in connection with an electronic program guide ("EPG") could also result in accessing of information. In this regard, as described in the referenced co-pending patent applications, an EPG may be displayed on the platform and selection/activation of a channel identifier (e.g., "ABC 2") may be used to cause the platform to transmit a command to tune a target appliance to the channel on which "ABC 2" is broadcast. It will be appreciated that in some circumstances this would cause the device to transmit a command to actually tune the target device to channel 2 and in other circumstances to transmit a command to tune the target device to another broadcast channel (either user programmed or specified in the content of the EPG) on which the service provider is carrying the content for "ABC 2" (i.e., channel 7 on the cable affiliate of the user). In connection with transmitting this command code, activation of the channel designating command icon in the EPG could also cause the platform to access information pertaining to the selected content provider. For example, the user could designate, using the methodology described above, that activation of the command icon "ABC" in the EPG additionally directs the platform to retrieve information from the national broadcaster of the content (e.g., "www.abc.com") or information from the local broadcaster of the content (e.g., from the local Los Angelas Affiliate Web site). While the user could program the platform to access information at a specified address, address information to be linked to an EPG operational icon could also be provided in connection with the downloading of the EPG into the platform. Any such downloaded address information may or may not be user editable. In any event, since the user would typically specify to the EPG provider their media service provider(s) for the purpose of populating the EPG, this information could also be used by the EPG provider to link addresses to broadcast station identifiers which addresses are used to access information when the broadcast station identifier icons in the EPG are selected to transmit commands to tune an electronic device to a desired content provider.

In addition, while described in the context of video broadcast information retrieval, it will be appreciated that other uses of the present invention are contemplated. For example, command icons used to tune a radio receiver to a radio station may also be used to access information related to the radio station, radio-station programming content, etc. Furthermore, since the user may be free to set the address to any desired address, the information retrieved is not limited to being associated with the operation to be performed by the platform in response to activation of the command icon to which the address is associated. For example, a viewer can setup a command icon to tune a television to a given content provider while activation of the command icon also causes the platform to retrieve information from, for example, an on-line auction Web site, such as "www.ebay.com," that is unrelated to the content provider.

While specific embodiments of the invention have been described in detail, it will be appreciated by those skilled in the art that various modifications and alternatives to those details could be developed in light of the overall teachings of the disclosure. For example, while described in the context of assigning addresses to command icons, the methods described herein can also be used to assign addresses to hard keys. Accordingly, the particular arrangement disclosed is meant to be illustrative only and not limiting as to the scope of the invention which is to be given the full breadth of the appended claims and any equivalents thereof. All of the references cited herein are hereby incorporated by reference in their entirety.

What is claimed is:

1. A method for causing media content to be presented on an appliance using a remote control device having a display and configured to communicate with the appliance, comprising:

causing the remote control device to display in the display of the remote control device a user interface element representative of a media content provider; and in direct response to a sensed interaction with the user interface element displayed in the display of the remote control device by the remote control device, causing the remote control device to transmit both a first command to cause the appliance to perform an operation to thereby provide access via the appliance to media content available from the media content provider and a second command to cause a retrieval of information from a network address that is predetermined within the remote control device prior to the sensed interaction with the user interface element; and causing the remote control to display the information retrieved from the network address in the display of the controlling device.

2. The method as recited in claim 1, wherein the network address comprises a wide area network address.

3. The method as recited in claim 2, comprising automatically mapping the wide area network address to the user interface element.

4. The method as recited in claim 2, comprising receiving input into the remote control device to manually map the wide area network address to the user interface element.

5. The method as recited in claim 2, wherein the wide area network address comprises a URL.

6. The method as recited in claim 1, wherein the user interface element representative of the media content provider is pre-stored in a memory of the remote control device.

7. The method as recited in claim 1, wherein the user interface element representative of the media content provider is retrieved from a memory of a device external to the remote control device.

8. The method as recited in claim 7, wherein the device external to the remote control device comprises an Internet server device.

9. The method as recited in claim 1, wherein the information that is retrieved using the network address comprises a further user interface element and wherein, in response to a sensed interaction with the further user interface element, causing the remote control device to transmit a third command to cause a retrieval of further information from a further network address.

10. The method as recited in claim 1, wherein the first command comprises a channel tuning command.

11. The method as recited in claim 1, wherein the display comprises a touch screen display.

12. The method as recited in claim 1, wherein the remote control device comprises a table computing device.

13. The method as recited in claim 1, wherein the first command is caused to be transmitted in a first signal and wherein the second command is caused to be transmitted in a second signal.

* * * * *